(12) United States Patent
Yamaoka et al.

(10) Patent No.: US 8,204,454 B2
(45) Date of Patent: Jun. 19, 2012

(54) DISTORTION COMPENSATOR APPARATUS, AMPLIFIER APPARATUS, TRANSMITTER, AND METHOD OF COMPENSATING DISTORTION

(75) Inventors: Atsushi Yamaoka, Kawasaki (JP); Keiichi Yamaguchi, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 708 days.

(21) Appl. No.: 12/303,381

(22) PCT Filed: May 29, 2007

(86) PCT No.: PCT/JP2007/000576
§ 371 (c)(1),
(2), (4) Date: Dec. 4, 2008

(87) PCT Pub. No.: WO2007/141908
PCT Pub. Date: Dec. 13, 2007

(65) Prior Publication Data
US 2009/0195309 A1 Aug. 6, 2009

(30) Foreign Application Priority Data
Jun. 8, 2006 (JP) .................. 2006-160274

(51) Int. Cl.
*H04B 1/04* (2006.01)
(52) U.S. Cl. .................. 455/114.2; 455/114.3; 330/149; 375/296
(58) Field of Classification Search .................. None
See application file for complete search history.

(56) References Cited

U.S. PATENT DOCUMENTS

| | | | |
|---|---|---|---|
| 5,699,383 A | 12/1997 | Ichiyoshi | |
| 5,870,668 A | 2/1999 | Takano et al. | |
| 6,072,364 A | 6/2000 | Jeckeln et al. | |
| 6,118,335 A * | 9/2000 | Nielsen et al. | 330/2 |
| 6,141,390 A * | 10/2000 | Cova | 375/297 |
| 6,489,846 B2 * | 12/2002 | Hatsugai | 330/149 |
| 6,587,514 B1 | 7/2003 | Wright et al. | |
| 6,642,786 B1 * | 11/2003 | Jin et al. | 330/149 |
| 6,859,099 B2 * | 2/2005 | Akaiwa | 330/149 |
| 6,947,711 B1 | 9/2005 | Leyonhjelm | |
| 2001/0007435 A1 * | 7/2001 | Ode et al. | 330/149 |
| 2002/0027473 A1 | 3/2002 | Hatsugai | |
| 2004/0032296 A1 * | 2/2004 | Akaiwa | 330/149 |
| 2004/0164798 A1 | 8/2004 | Adachi et al. | |

(Continued)

FOREIGN PATENT DOCUMENTS
GB 2 337 169 11/1999

(Continued)

OTHER PUBLICATIONS

Japanese Office Action issued on Mar. 15, 2011 in corresponding Japanese Application No. 2006-160274 (with an English Translation).

(Continued)

*Primary Examiner* — Tuan T Lam
(74) *Attorney, Agent, or Firm* — Oblon, Spivak, McClelland, Maier & Neustadt, L.L.P.

(57) ABSTRACT

This distortion compensator apparatus is a distortion compensator apparatus compensating nonlinearity of an amplifier and includes: a memory storing a compensation parameter used for correcting an input signal of the amplifier; a compensator correcting the input signal of the amplifier based on the compensation parameter; and an update controller updating the compensation parameter according to an operation state of the amplifier.

8 Claims, 8 Drawing Sheets

U.S. PATENT DOCUMENTS

| | | | |
|---|---|---|---|
| 2004/0264598 A1* | 12/2004 | Demir et al. | 375/297 |
| 2005/0258898 A1 | 11/2005 | Hongo | |
| 2006/0091950 A1* | 5/2006 | Hayase | 330/149 |
| 2007/0008033 A1* | 1/2007 | Okazaki | 330/149 |
| 2008/0197925 A1* | 8/2008 | Furuta et al. | 330/149 |

FOREIGN PATENT DOCUMENTS

| | | |
|---|---|---|
| GB | 2 394 374 | 4/2004 |
| JP | 9-69733 A | 3/1997 |
| JP | 3139395 | 6/1998 |
| JP | 2001 36353 | 2/2001 |
| JP | 2002-111397 | 4/2002 |
| JP | 2004-187218 A | 7/2004 |
| JP | 2005-72747 | 3/2005 |

OTHER PUBLICATIONS

Office Action in Japanese Application No. 2006-160724, mailed on Dec. 13, 2011.

* cited by examiner

DISTORTION COMPENSATOR APPARATUS, AMPLIFIER APPARATUS, TRANSMITTER, AND METHOD OF COMPENSATING DISTORTION

TECHNICAL FIELD

The present invention relates to a distortion compensator apparatus, for example, compensating nonlinearity of an amplifier, an amplifier apparatus and a transmitter whose nonlinearity is compensated, and a method of compensating distortion.

BACKGROUND ART

As speed and data volume of radio communication increases, there has arisen an increasing demand for accurate linearity of an amplifier, in particular, a power amplifier, but in the power amplifier, input power is in a trade-off relation with linearity and efficiency. That is, when an input signal is small, linearity and efficiency are high, and when the input signal is large, linearity and efficiency are low. Therefore, there have been proposed techniques to compensate nonlinearity of a power amplifier so as to achieve high linearity and high efficiency even when an input signal is large.

As techniques to compensate nonlinearity of a power amplifier, there have been known techniques such as a negative feedback method, a feed-forward method, an analog pre-distortion method in which the nonlinearity is compensated in an analog signal stage. In recent years, a digital pre-distortion method has been drawing attention which estimates a characteristic of a power amplifier by using digital signal processing and gives inverse distortion to a digital signal in advance (see, for example, JP-A 2001-36353 (KOKAI)).

A pre-distortion method disclosed in JP-A 2001-36353 (KOKAI) combines the compensation of an amplitude characteristic and the compensation of a phase characteristic. Specifically, as the compensation of the amplitude characteristic, amplitudes $V_i$, $V_q$ of output baseband signals I, Q of roll-off filters are first inputted to polynomial operation units, which then perform a polynomial operation to compensate an amplitude-amplitude characteristic (hereinafter, it will be referred to as an "amplitude characteristic", and similarly, an "amplitude-phase characteristic" will be referred to as a "phase characteristic"). Then, as the compensation of the phase characteristic, a power calculator calculates power (square sum) by using signals $g(V_i)$, $g(V_q)$ resulting from the compensation of the amplitude characteristic, and based on the calculation result, a compensation value is read from a table storing an inverse characteristic of the phase characteristic of the power amplifier, and the compensation value and the signals resulting from the compensation of the amplitude characteristic are multiplied. With a small-capacity table memory and a small-scale arithmetic logic, this procedure is executed, thereby realizing the compensation of nonlinearity of the power amplifier.

Generally, the operation state of a power amplifier changes depending on a surrounding environment and a characteristic of a signal to be amplified, and therefore, according to such a change, a compensation value or a compensation coefficient used for compensating the amplitude characteristic and the phase characteristic need to be updated in order to ensure linearity of the power amplifier. However, since the update of the compensation value or the compensation coefficient requires power consumption, there is a demand for a technique to realize both linearity of the power amplifier and reduced power consumption.
Patent Citation 1: Patent 2001-036353

DISCLOSURE OF INVENTION

Technical Problem

As described above, conventional distortion compensator apparatuses, amplifier apparatuses, transmitters, and methods of compensating distortion have a problem that it is difficult to realize both ensuring linearity and reducing power consumption. The present invention was made to solve such a problem and an object thereof is to provide a distortion compensator apparatus, an amplifier apparatus, a transmitter, and a method of compensating distortion capable of both ensuring linearity of an amplifier and reducing power consumption.

Technical Solution

To attain the above object, a distortion compensator apparatus of a first aspect of the present invention is a distortion compensator apparatus compensating nonlinearity of an amplifier and includes: a memory storing a compensation parameter used for compensating an input signal of the amplifier; a compensator correcting the input signal of the amplifier based on the compensation parameter; and an update controller updating the compensation parameter according to an operation state of the amplifier.

An amplifier apparatus of a second aspect of the present invention includes: an amplifier; a memory storing a compensation parameter used for correcting an input signal of the amplifier in order to compensate nonlinearity of the amplifier; a compensator correcting the input signal of the amplifier based on the compensation parameter; and an update controller updating the compensation parameter according to an operation state of the amplifier.

A transmitter of a third aspect of the present invention includes the amplifier apparatus of the second aspect of the present invention; and a modulator modulating the input signal corrected by the compensator to input the modulated input signal to the amplifier.

A method of compensating distortion of a fourth aspect of the present invention is a method of compensating distortion for compensating nonlinearity of an amplifier and includes: storing in a memory a compensation parameter used for correcting an input signal of the amplifier; correcting the input signal of the amplifier based on the compensation parameter; and updating the compensation parameter according to the operation state of the amplifier.

Advantageous Effects

According to the present invention, it is possible both to ensure linearity of an amplifier and to reduce power consumption.

EXPLANATION OF REFERENCE 1 transmitter
10 data generator
20 distortion compensator
21 amplitude characteristic compensator
22 phase characteristic compensator
23 amplitude characteristic calculator
24 phase characteristic calculator
25 update controller
30 D/A converter
40 low pass filter
50 quadrature modulator
60 power amplifier
70 antenna
80 to 87 monitor signal generator

BEST MODE FOR CARRYING OUT THE INVENTION

In a distortion compensator apparatus, an amplifier apparatus, a transmitter, and a method of compensating distortion according to an embodiment of the present invention, compensation data of an amplitude characteristic and compensation data of a phase characteristic are updated by utilizing a change in a nonlinear characteristic of an amplifier which occurs according to a change in the amplifier and its surrounding environment.

Figure 1:
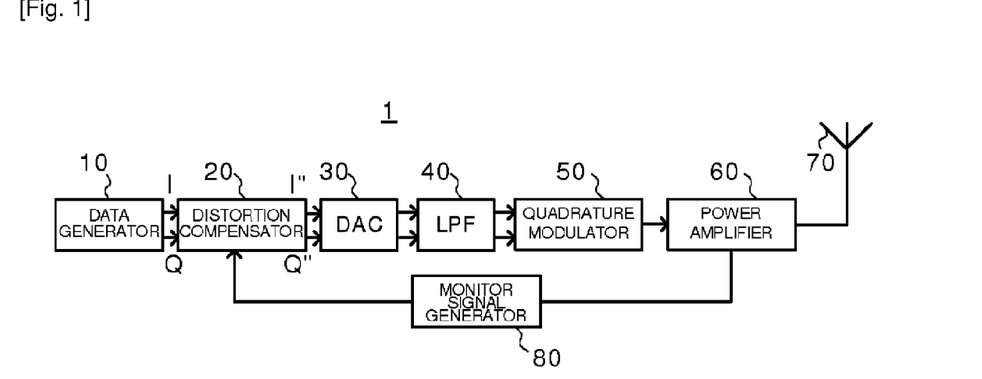
FIG. 1 is a block diagram showing the configuration of a transmitter according to one embodiment of the present invention.

Hereinafter, an embodiment of the present invention will be described in detail with reference to the drawings. FIG. 1 is a block diagram showing a transmitter according to the embodiment of the present invention including a distortion compensator compensating nonlinearity of a power amplifier. As shown in FIG. 1, a transmitter 1 of this embodiment includes a data generator 10, a distortion compensator 20, a D/A converter (DAC) 30, a lower pass filter (LPF) 40, a quadrature modulator 50, a power amplifier 60, an antenna 70, and a monitor signal generator 80.

The data generator 10 generates a transmission signal to be transmitted by the transmitter 1. Various types are usable as the data generator 10 depending on the kind of transmitted information. For example, if the transmitted information is sound, the data generator 10 is constituted by a microphone, an A/D converter, or the like. If the transmitted information is digital data, the data generator 10 is constituted by a computer terminal or the like. Alternatively, information transmitted from an external part of the transmitter 1 may be inputted as digital data. In this embodiment, as the transmission signal, the data generator 10 outputs two signals, that is, digital baseband signals I and Q.

The distortion compensator 20 is a signal processor compensating nonlinear distortion occurring in the power amplifier 60 and is a so-called pre-distorter. The distortion compensator 20 has a function of compensating an amplitude characteristic and a phase characteristic of the inputted transmission signals in a predetermined manner. Further, the distortion compensator 20 is capable of updating compensation data (hereinafter, sometimes referred to as a "compensation value" or a "compensation coefficient") of the amplitude characteristic and compensation data of the phase characteristic, based on a monitor signal obtained from the power amplifier 60 via the monitor signal generator 80. The distortion compensator 20 processes the transmission signals received from the data generator 10 so that the transmission signals have an inverse characteristic of a nonlinear region of the power amplifier 60, and sends the resultant signals to the D/A converter 30.

The D/A converter 30 converts the digital signals outputted from the distortion compensator 20 to analog signals. The D/A converter 30 sends the analog-converted transmission signals to the low pass filter 40. The low pass filter 40, which is intended to remove noise and folding noise generated by the conversion processing in the D/A converter 30, filters the received transmission signals to send the resultant signals to the quadrature modulator 50.

The quadrature modulator 50 quadrature-modulates the inputted baseband signals I" and Q" to output the resultant signal as the transmission signal to the power amplifier 60. The power amplifier 60 amplifies the transmission signal resulting from the quadrature modulation to predetermined output power. The antenna 70 radiates the transmission signal amplified by the power amplifier 60 as a radio wave.

The monitor signal generator 80 is an amplifier monitor monitoring the state of the power amplifier 60. According to the state of the power amplifier 60, the monitor signal generator 80 generates a monitor signal controlling the update of the compensation data which are used by the distortion compensator 20 for distortion compensation processing. As the monitor signal, usable are parameters correlated with a change in a characteristic function in the power amplifier, such as, for example, power of the transmission signal outputted from the power amplifier 60, an adjacent channel leakage ratio of the power amplifier 60, a gain occurring in an analog signal processing system such as the D/A converter 30 and the quadrature modulator 50, a phase difference occurring in the analog signal processing system, a characteristic coefficient of the power amplifier 60, temperature of the power amplifier 60, a frequency of the transmission signal, and the like. The monitor signal generated by the monitor signal generator 80 is sent to the distortion compensator 20.

In this transmitter 1, the digital baseband signals I, Q generated by the data generator 10 are inputted to the distortion compensator 20, and the distortion compensator 20 applies the distortion compensation processing to the baseband signals I, Q. The D/A converter 30 converts the distortion-compensated baseband signals to analog baseband signals to input them to the low pass filter 40. The low pass filter 40 cuts high-band components (noise components) from the inputted signals to send the resultant signals to the quadrature modulator 50. The quadrature modulator 50 quadrature-modulates the received signals to send the resultant signal to the power amplifier 60. At this time, the transmission signal is converted to a predetermined frequency. The power amplifier 60 amplifies the transmission signal to predetermined power to send the amplified transmission signal to the antenna 70.

Here, the monitor signal generator 80 monitors the state of the power amplifier 60 to generate the monitor signal indicating the state of the power amplifier 60, and sends the generated monitor signal to the distortion compensator 20. According to the monitor signal, the distortion compensator 20 updates the compensation data used in the distortion compensator 20.

According to the transmitter of this embodiment, since the monitor signal indicating the operation state of the power amplifier is generated and the compensation data of the distortion compensator is updated based on the monitor signal, it is possible both to ensure linearity of the power amplifier and to reduce power consumption.

Figure 2:
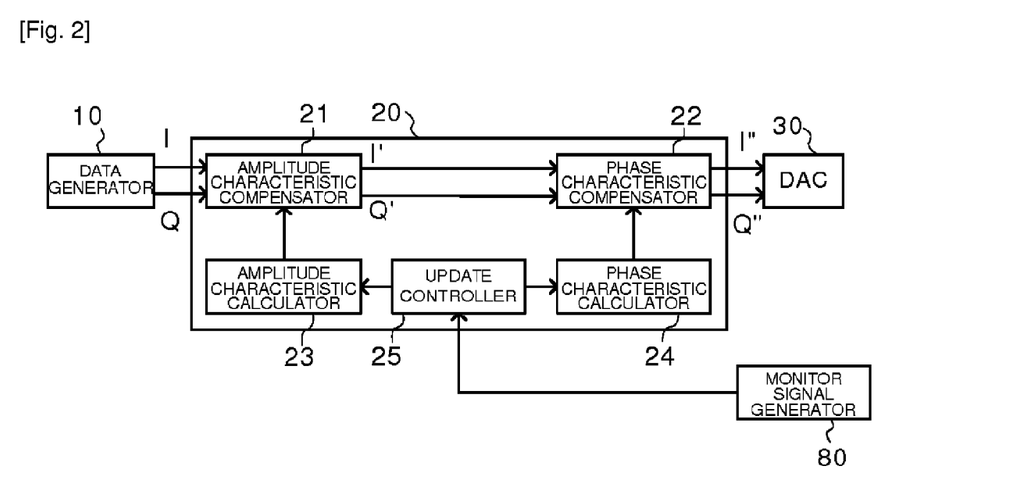
FIG. 2 is a block diagram showing an overview of a distortion compensator of this embodiment.
Figure 3:
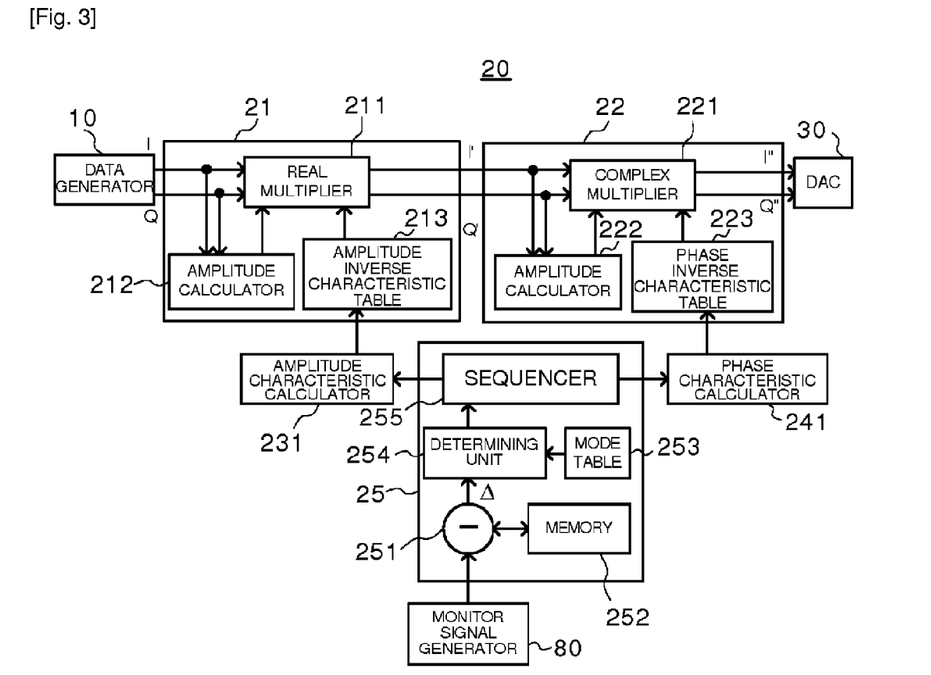
FIG. 3 is a block diagram showing the configuration of the distortion compensator of this embodiment in detail.

Next, the configuration of the distortion compensator 20 of this embodiment will be described with reference to FIG. 2 and FIG. 3. As shown in FIG. 2, the distortion compensator 20 of this embodiment includes an amplitude characteristic compensator 21, a phase characteristic compensator 22, an amplitude characteristic calculator 23, a phase characteristic calculator 24, and an update controller 25.

The amplitude characteristic compensator 21 is a signal processor compensating the amplitude characteristic of the baseband signals I, Q inputted from the data generator 10. The amplitude characteristic compensator 21 corrects the inputted baseband signals with an inverse characteristic of the amplitude characteristic out of nonlinear characteristics of the power amplifier 60, to ensure linearity of the power amplifier 60. Further, the phase characteristic compensator 22 is a signal processor compensating the phase characteristic of baseband signals I', Q' resulting from the correction by the amplitude characteristic compensator 21. The phase characteristic compensator 22 corrects the baseband signals I', Q' with an inverse characteristic of the phase characteristic out of the nonlinear characteristics of the power amplifier 60, to ensure linearity of the power amplifier 60.

The amplitude characteristic calculator 23 is an arithmetic processor for performing predetermined arithmetic processing in order to update the compensation data used in the amplitude characteristic compensator 21. Further, the phase characteristic calculator 24 is an arithmetic processor for performing predetermined arithmetic processing in order to update the compensation data used in the phase characteristic compensator 22. The update controller 25 controls an update of the content to decide the timing for updating the respective compensation data used in the amplitude characteristic compensator 21 and the phase characteristic compensator 22, based on the monitor signal sent from the monitor signal generator 80. The update controller 25 has a function of determining which compensation data is appropriate as the content to be updated. For example, the update controller 25 determines whether only the compensation data of the amplitude characteristic should be updated, only the compensation data of the phase characteristic should be updated, the compensation data of both the amplitude characteristic and the phase characteristic should be updated, or the like. The update controller 25 also has a function of instructing the amplitude characteristic calculator 23 and/or the phase characteristic calculator 24 which timing each of the compensation data is to be updated.

When receiving the monitor signal from the monitor signal generator 80, the update controller 25 decides, based on the monitor signal, whether or not the compensation data of the amplitude characteristic and/or the phase characteristic should be updated and what is the timing of the update, and if the update is necessary, the update controller 25 instructs the amplitude characteristic calculator 23 and the phase characteristic calculator 24 to calculate the compensation data. The amplitude characteristic calculator 23 and the phase characteristic calculator 24 receiving the instruction update the compensation data used in the amplitude characteristic compensator 21 and the phase characteristic compensator 22.

The amplitude characteristic compensator 21 compensates the amplitude characteristic of the transmission signals to send the resultant transmission signals to the phase characteristic compensator 22, and the phase characteristic compensator 22 compensates the phase characteristic of the transmission signals whose amplitude characteristics have been compensated. After the compensation data used in the amplitude characteristic compensator 21 and the phase characteristic compensator 22 are updated, the amplitude characteristic compensator 21 and the phase characteristic compensator 22 execute the compensation for the transmission signals based on the updated compensation data.

In this manner, according to the distortion compensator apparatus of this embodiment, since the amplitude characteristic and/or the phase characteristic are/is compensated at a predetermined timing based on the monitor signal, each of the characteristics can be compensated at an independent timing, which can realize both effective distortion compensation processing and reduced power consumption.

Next, the configurations of the amplitude characteristic compensator 21, the phase characteristic compensator 22, the amplitude characteristic calculator 23, the phase characteristic calculator 24, and the update controller 25 according to this embodiment will be described in detail. As shown in FIG. 3, the amplitude characteristic compensator 21 includes a real multiplier 211, an amplitude calculator 212, and an amplitude inverse characteristic table 213. The phase characteristic compensator 22 includes a complex multiplier 221, an amplitude calculator 222, and a phase inverse characteristic table 223. The update controller 25 includes a subtractor 251, a memory 252, a mode table 253, a determining unit 254, and a sequencer 255. The amplitude characteristic calculator 23 functions as an amplitude characteristic calculator 231 calculating the compensation data of the amplitude characteristic, and the phase characteristic calculator 24 functions as a phase characteristic calculator 241 calculating the compensation data of the phase characteristic.

The real multiplier 211 is an arithmetic processor for performing multiplication processing on real number parts of the digital baseband signals as the transmission signals. The amplitude calculator 212 is an arithmetic processor for calculating an amplitude value of the above baseband signals. The amplitude inverse characteristic table 213 is a definition memory storing the amplitude values of the baseband signals and compensation coefficients of the corresponding amplitude characteristic in correspondence to each other.

The complex multiplier 221 is an arithmetic processor for performing multiplication processing on complex number parts of the baseband signals resulting from the multiplication processing by the real multiplier 211. The amplitude calculator 222 corresponds to the amplitude calculator 212, and is an arithmetic processor for calculating an amplitude value of the baseband signals resulting from the multiplication processing by the real multiplier 211. The phase inverse characteristic table 241 is a definition memory storing the amplitude values of the baseband signals resulting from the multiplication processing by the real multiplier 211 and compensation coefficients of the corresponding phase characteristic in correspondence to each other.

The subtractor 251 is an arithmetic processor for calculating a difference between a monitor signal sent from the monitor signal generator 80 and a monitor signal received at the time of the last update processing. That is, the subtractor 251 operates to calculate a difference between the former monitor signal and the latter monitor signal which are consecutive in time series, thereby calculating a variation width of the monitor signals. The memory 252 is a memory storing, as a reference signal, the monitor signal received at the time of the last update processing. The mode table 253 is a memory storing the contents for which the compensation coefficient of the distortion compensator 20 is to be updated (update modes). The determining unit 254 compares the difference calculated by the subtractor 251 and a not-shown threshold value, and when the difference exceeds the threshold value, selects an appropriate mode from the update modes stored in the mode table 253. The sequencer 255 instructs the amplitude characteristic calculator 231 and the phase characteristic calculator 241, based on the update mode selected by the determining unit 254, that the compensation coefficient of the amplitude characteristic and the phase characteristic be updated and at which timing the update should be made.

When receiving the baseband signals I, Q as the transmission signals from the data generator 10, the amplitude calculator 212 calculates the amplitude value of the baseband signals I, Q to send the result to the real multiplier 211. Next, by using the received amplitude value, the real multiplier 211 reads the compensation coefficient of the amplitude characteristic from the amplitude inverse characteristic table 213. The real multiplier 211 performs the multiplication processing on the baseband signals I, Q and the read compensation coefficient to compensate the amplitude characteristic.

After the amplitude characteristic is compensated, the amplitude calculator 222 calculates the amplitude value of the signals I', Q' resulting from the compensation of the amplitude characteristic to send the result to the complex multiplier 221. Next, by using the received amplitude value, the complex multiplier 221 reads the compensation coefficient of the phase characteristic from the phase inverse characteristic table 223. Then, the complex multiplier 221 performs the complex multiplication processing on the baseband signals I', Q' which result from the amplitude characteristic correction, and the read compensation coefficient, thereby compensating the phase characteristic. Transmission signals (baseband signals I", Q") resulting from the compensation of the amplitude characteristic and the phase characteristic are sent to the D/A converter 30.

Figure 4:
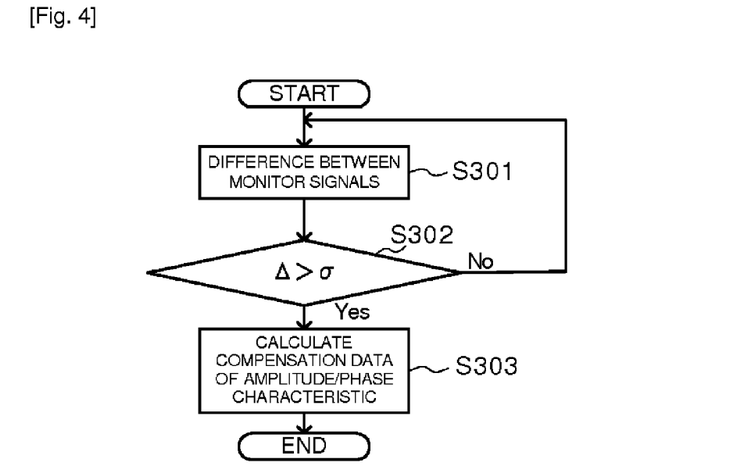
FIG. 4 is a flowchart showing an operation of the distortion compensator of this embodiment.

Here, an update determining operation of the update controller 25 will be described in detail with reference to FIG. 4. When receiving a monitor signal from the monitor signal generator 80, the subtractor 251 calculates a difference value "D" (called as "delta") between the received monitor signal and a monitor signal received at the time of the last update which is stored in the memory 252 (step 301. Such steps will be hereinafter written as "S301" and the like). After calculating the difference value "D", the subtractor 251 sends the difference result to the determining unit 254.

The determining unit 254 compares the received difference value "D" and a threshold value "s" (called as "sigma") held by the determining unit 254 (S302).

When the difference value "D" is equal to or smaller than the threshold value "s" (No at S302), the determining unit 254 does not give any instruction to update the compensation data. The subtractor 251 continues the subtraction processing of monitor signals.

When the difference value "D" exceeds the threshold value "s" (Yes at S302), the determining unit 254 reads an appropriate update mode corresponding to the threshold value from the mode table 253 to send the read update mode to the sequencer 255. According to the received update mode, the sequencer 255 instructs the amplitude characteristic calculator 231 and/or the phase characteristic calculator 241 to calculate the compensation data of the amplitude characteristic and/or the phase characteristic (S303). For example, when receiving an update mode in which the amplitude characteristic and the phase characteristic are both compensated, the sequencer 255 instructs both the amplitude characteristic calculator 231 and the phase characteristic calculator 241 to calculate the respective compensation data at a predetermined timing.

Figure 5:
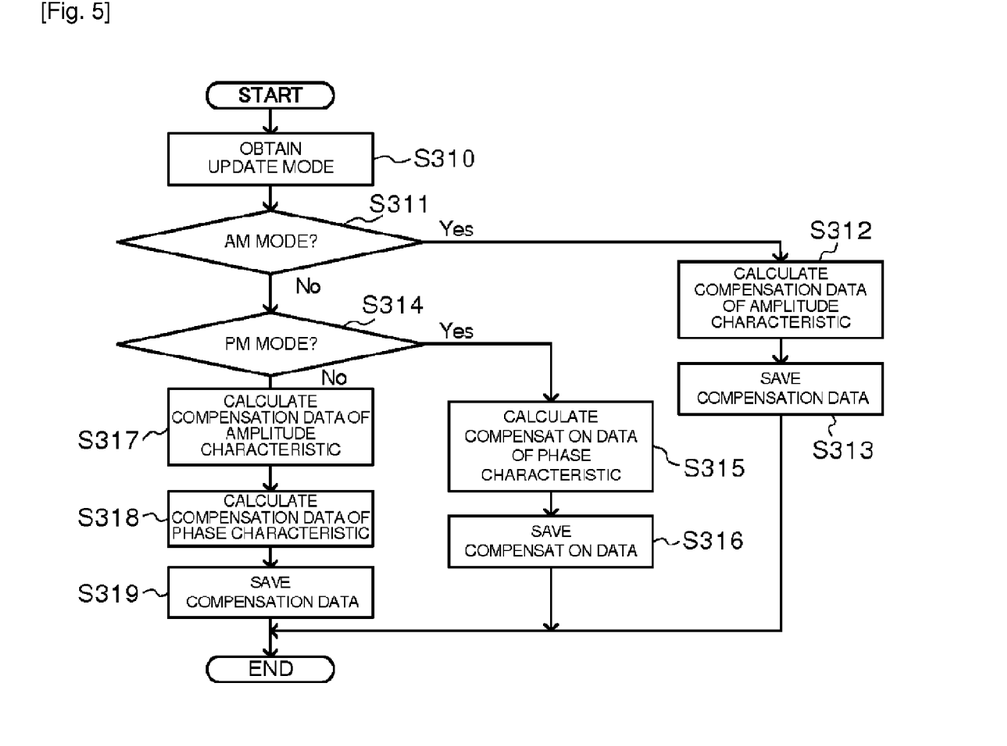
FIG. 5 is a flowchart showing an operation of an update controller of this embodiment.

Next, a compensation data calculation instructing operation of the update controller 25 will be described in detail with reference to FIG. 5. When receiving the update mode from the determining unit 254 (S310), the sequencer 255 determines which mode the update mode is (S311).

When the update mode is an AM mode, that is, a mode in which only the compensation data of the amplitude characteristic is updated (Yes at S311), the sequencer 255 instructs the amplitude characteristic calculator 231 to calculate the compensation data of the amplitude characteristic. When receiving the instruction to calculate the compensation data of the amplitude characteristic, the amplitude characteristic calculator 231 calculates predetermined amplitude characteristic compensation data (S312).

After calculating the compensation data, the amplitude characteristic calculator 231 saves the compensation data in the amplitude inverse characteristic table 213 (S313).

When the update mode is a PM mode, that is, a mode in which only the compensation data of the phase characteristic is updated (Yes at S314), the sequencer 255 instructs the phase characteristic calculator 241 to calculate the compensation data of the phase characteristic. When receiving the instruction to calculate the compensation data of the phase characteristic, the phase characteristic calculator 241 calculates predetermined phase characteristic compensation data (S315).

After calculating the compensation data, the phase characteristic calculator 241 saves the compensation data in the phase inverse characteristic table 223 (S316).

When the update mode is an AM+PM mode, that is, a mode in which the compensation data of the amplitude characteristic and the phase characteristic are updated (No at S314), the sequencer 255 instructs the amplitude characteristic calculator 231 to calculate the compensation data of the amplitude characteristic and also instructs the phase characteristic calculator 241 to calculate the compensation data of the phase characteristic.

When receiving the instruction to calculate the compensation data of the amplitude characteristic, the amplitude characteristic calculator 231 calculates predetermined amplitude characteristic compensation data (S317). Further, when receiving the instruction to calculate the compensation data of the phase characteristic, the phase characteristic calculator 241 calculates predetermined phase characteristic compensation data (S318).

After calculating the compensation data, the amplitude characteristic calculator 231 saves the compensation data in the amplitude inverse characteristic table 213 and the phase characteristic calculator 241 saves the compensation data in the phase inverse characteristic table 223 (S319).

As described above, in the distortion compensator apparatus, the amplifier apparatus, the transmitter, and the method of compensating distortion of this embodiment, since the compensation data for distortion compensation is updated based on the monitor signal indicating the operation state of the power amplifier, it is possible both to ensure linearity of the power amplifier and to reduce power consumption. Further, in the distortion compensator apparatus, the amplifier apparatus, the transmitter, and the method of compensating distortion of this embodiment, since the update of the compensation data for the distortion compensation can be set in detail according to the monitor signal, detailed setting can be made for the distortion compensation. That is, according to the state of the power amplifier, it is possible to update only the compensation data of the amplitude characteristic, update only the compensation data of the phase characteristic, or update the compensation data of both the amplitude characteristic and the phase characteristic together.

Here, the monitor signal indicating the operation state of the power amplifier can indicate output power of the power amplifier, a gain of an analog stage, a phase difference in the analog stage, temperature of the power amplifier, a used frequency, a characteristic coefficient of the power amplifier, and an adjacent channel leakage ratio. Further, the compensation data may be updated every predetermined time by using a timer instead of using the monitor signal.

Figure 6:
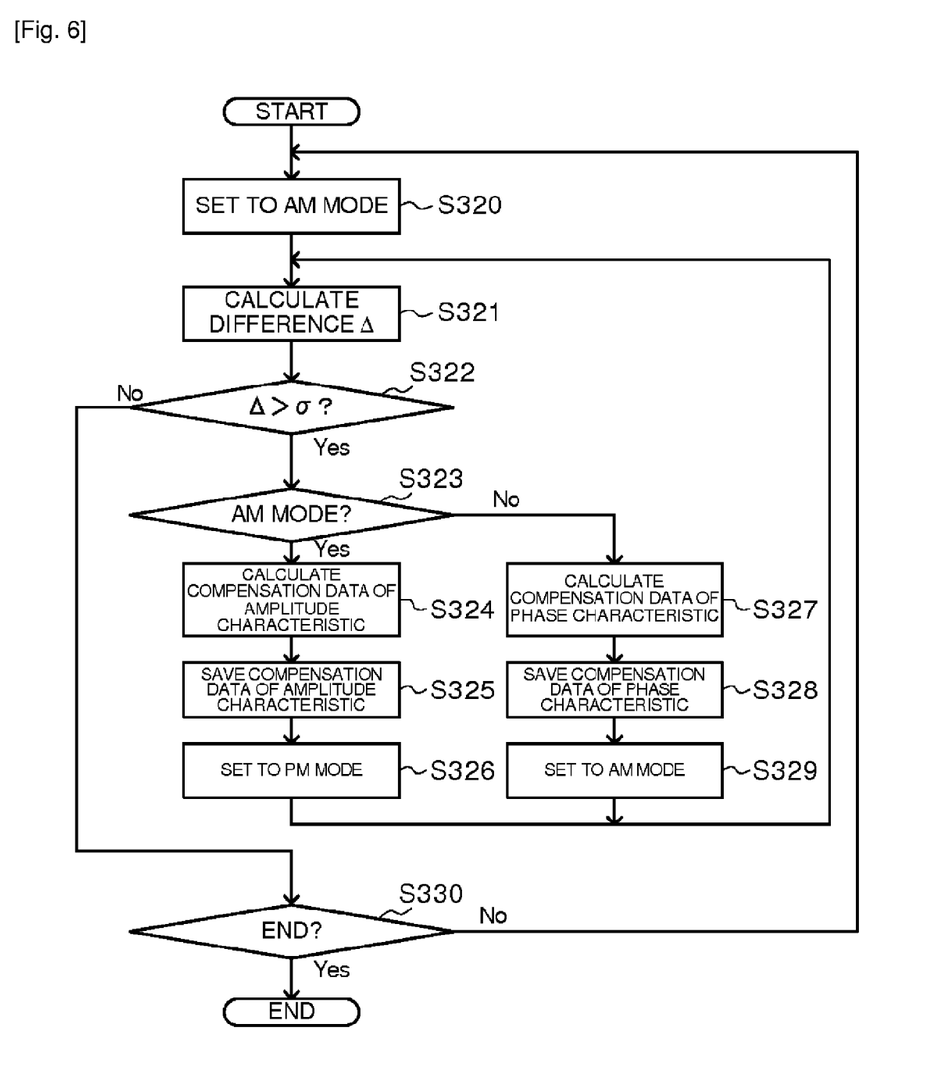
FIG. 6 is a flowchart showing an operation of the update controller of this embodiment.

Next, another example of the update determining operation of the update controller 25 will be described in detail with reference to FIG. 6. In the operation example in FIG. 6, a monitor signal is obtained again immediately after the compensation data of the amplitude characteristic is updated, and if a difference value still exceeds the threshold value, the compensation data of the phase characteristic is updated.

The determining unit 254 sets in advance the update mode to the AM mode in which the compensation data of the amplitude characteristic is updated (S320).

When receiving a monitor signal from the monitor signal generator 80, the subtractor 251 calculates a difference value "D" between the received monitor signal and a monitor signal received at the time of the last update which is stored in the memory 253 (S321). After calculating the difference value "D", the subtractor 251 sends the difference result to the determining unit 254.

The determining unit 254 compares the received difference value "D" and a threshold value "s" held by the determining unit 254 (S322).

When the difference value "D" is equal to or smaller than the threshold value "s" (No at S322), the determining unit 254 does not give any instruction to update the compensation data, and when the processing should be continued, the determining unit 254 sets the update mode to the initial value, that is, the AM mode (No at S330), and the subtractor 251 continues the subtraction processing of monitor signals.

When the difference value "D" exceeds the threshold value "s" (Yes at S322), the determining unit 254 sends the current update mode to the sequencer 255. The sequencer 255 determines which mode the received update mode is (S323).

Since the update mode as the initial value is the AM mode (Yes at S323), the sequencer 255 instructs the amplitude characteristic calculator 231 to calculate the compensation data of the amplitude characteristic. The amplitude characteristic calculator 231 receiving the instruction calculates predetermined amplitude characteristic compensation data (S324).

After calculating the compensation data, the amplitude characteristic calculator 231 saves the compensation data in the amplitude inverse characteristic table (S325).

After sending the update mode to the sequencer 255, the determining unit 254 sets the update mode to the PM mode in which the compensation data of the phase characteristic is updated (S326).

When receiving a monitor signal from the monitor signal generator 80, the subtractor 251 continues to calculate a difference value "D" between the received monitor signal and the monitor signal received at the time of the last update which is stored in the memory 253 (S321). After calculating the difference value "D", the subtractor 251 sends the difference result to the determining unit 254.

The determining unit 254 compares the received difference value "D" and the threshold value "s" held by the determining unit 254 (S322).

When the difference value "D" is equal to or smaller than the threshold value "s" (No at S322), the determining unit 254 does not give any instruction to update the compensation data, and when the processing should be continued, the determining unit 254 sets the update mode to the initial value, that is, the AM mode (No at S330), and the subtractor 251 continues the subtraction processing of monitor signals.

When the difference value "D" still exceeds the threshold value "s" (Yes at S322), the determining unit 254 sends the current update mode to the sequencer 255. The sequencer 255 determines which mode the received update mode is (S323).

Since the update mode is set to the PM mode at Step 326 (No at S323), the sequencer 255 instructs the phase characteristic calculator 241 to calculate the compensation data of the phase characteristic. The phase characteristic calculator 241 receiving the instruction calculates predetermined phase characteristic compensation data (S327).

After calculating the compensation data, the phase characteristic calculator 241 saves the compensation data in the phase inverse characteristic table 223 (S328).

After sending the update mode to the sequencer 255, the determining unit 254 sets the update mode to the AM mode in which the compensation data of the amplitude characteristic is updated (S329).

As described above, according to the update controller 25 of this operation example, since the compensation data of the amplitude characteristic and the compensation data of the phase characteristic are alternately updated, well-balanced update of the compensation data can be realized.

Figure 7:
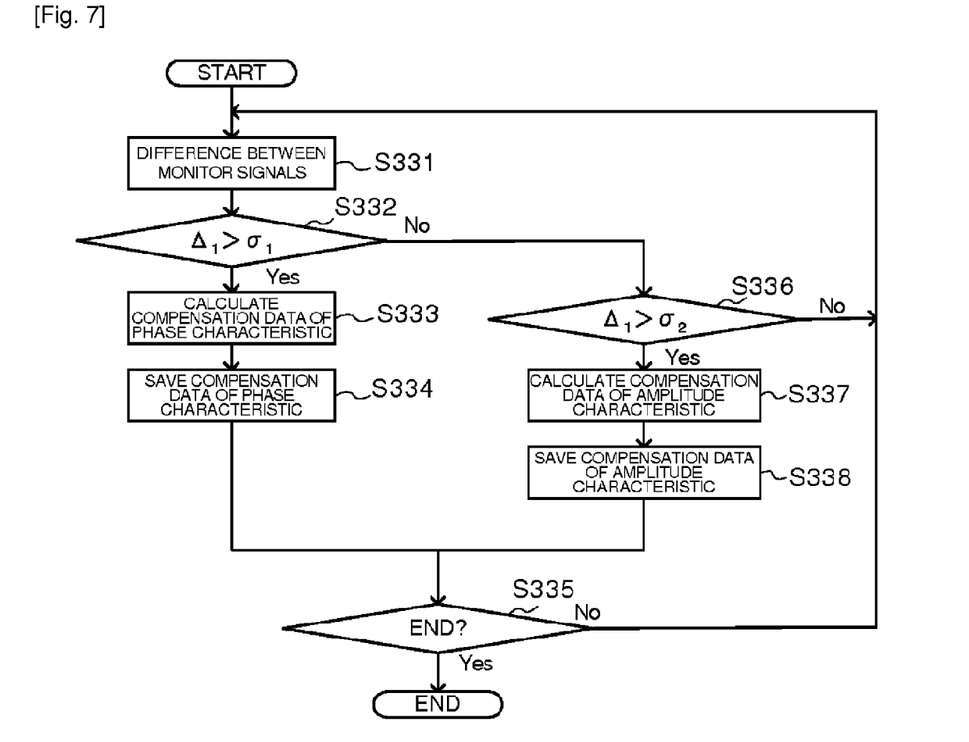
FIG. 7 is a flowchart showing an operation of the update controller of this embodiment.

Next, another example of the update determining operation of the update controller 25 will be described in detail with reference to FIG. 7. FIG. 7 shows an operation example in a case where the same monitor signal is used for updating the compensation data of the amplitude characteristic and for updating the compensation data of the phase characteristic, and threshold values corresponding to the updates of the respective characteristics are different.

When receiving a monitor signal from the monitor signal generator 80, the subtractor 251 calculates a difference value "$D_1$" between the received monitor signal and a monitor signal received at the time of the last update which is stored in the memory 253 (S331). After calculating the difference value, the subtractor 251 sends the difference result to the determining unit 254.

The determining unit 254 compares the received difference value "$D_1$" and a first threshold value "$s_1$" held by the determining unit 254 (S332).

When the difference value "$D_1$" exceeds the threshold value "$s_1$" (Yes at S332), the determining unit 254 sends the sequencer 255 the PM mode as the update mode, and the sequencer 255 instructs the phase characteristic calculator 241 to calculate the compensation data of the phase characteristic, as the compensation data to be updated in the PM mode selected from the mode table 253 (S333).

After calculating the compensation data, the phase characteristic calculator 241 saves the compensation data in the phase inverse characteristic table 223 (S334).

When the difference value "$D_1$" is equal to or smaller than the threshold value "$s_1$" (No at S332), the determining unit 254 further compares the difference value "$D_1$" and a second threshold value "$s_2$" held by the determining unit 254.

When the difference value "$D_1$" exceeds the threshold value "$s_2$" (Yes at S336), the determining unit 254 sends the sequencer 255 the AM mode as the update mode, and the sequencer 255 instructs the amplitude characteristic calculator 231 to calculate the compensation data of the amplitude characteristic, as the compensation data to be updated in the AM mode selected from the mode table 253 (S337).

After calculating the compensation data, the amplitude characteristic calculator 231 saves the compensation data in the amplitude inverse characteristic table 213 (S338).

When the difference value "$D_1$" is equal to or smaller than the threshold value "$s_2$" (No at S336), the determining unit 254 does not give any instruction to update the compensation data, and the subtractor 251 continues the subtraction processing of monitor signals.

When the update processing is to be finished (Yes at S335), the processing is ended.

In the operation example shown in FIG. 7, the threshold value "$s_1$" is set higher than the threshold value "$s_2$", and the determining unit 254 operates so that the update of the compensation data of the amplitude characteristic is executed (S338) with higher priority over the update of the compensation data of the phase characteristic (S334) (is executed even if the difference value "D" is small). This is because, in the power amplifier, the amplitude characteristic has a stronger influence on characteristic deterioration than the phase characteristic, and setting the frequency of updating the compensation data of the amplitude characteristic higher than the frequency of updating the compensation data of the phase characteristic can more reduce power consumption while preventing characteristic deterioration than simultaneously updating the compensation data of the amplitude characteristic and the compensation data of the phase characteristic. Incidentally, in the example shown in FIG. 7, the smaller threshold value "$s_2$" is for the update of the compensation data of the amplitude characteristic and the larger threshold value "$s_1$" is for the update of the compensation data of the phase characteristic, but this is not restrictive. For example, the larger threshold value "$s_1$" may correspond to the update of the compensation data of the amplitude characteristic and the phase characteristic. That is, when the difference value "D" exceeds the smaller threshold value, only the compensation data of the amplitude characteristic is updated, and when the difference value "D" exceeds the larger threshold value, the compensation data of the phase characteristic in addition to the compensation data of the amplitude characteristic is further updated. Consequently, when the difference value "D" is small, only the compensation data of the amplitude characteristic can be updated, and when the difference value "D" is large (when variation from a normal state is large), all the compensation data of the amplitude characteristic and the phase characteristic can be updated.

Here, a modified example of the update controller 25 will be described with reference to FIG. 8. An update controller 250 shown in FIG. 8 further includes a subtractor 256 in addition to the structure of the update controller 25 shown in FIG. 3. Common elements are denoted by the same reference numerals and symbols and repeated description thereof will be omitted.

Figure 8:
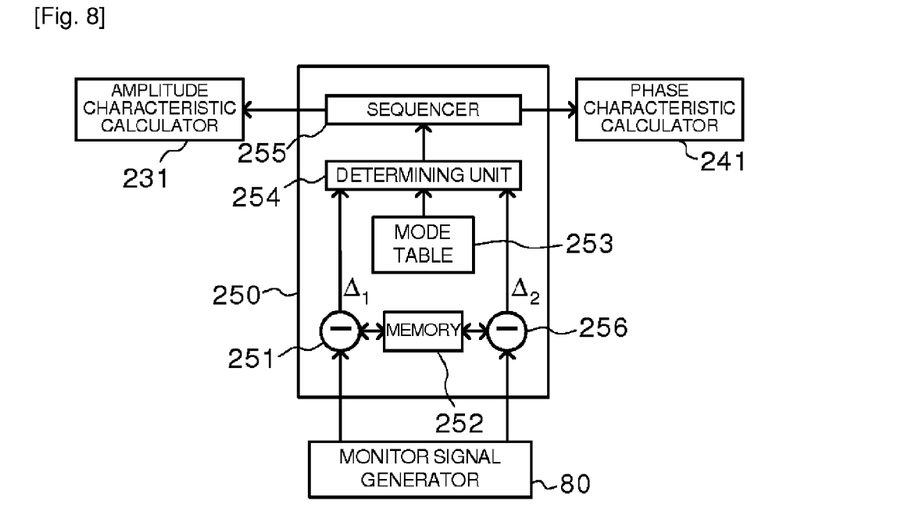
FIG. 8 is a block diagram showing another example of the update controller of this embodiment.

In the update controller 250 shown in FIG. 8, two kinds of monitor signals are received from the monitor signal generator 80, and the subtractors 251 and 256 calculate difference values "$D_1$", "$D_2$" between the monitor signals respectively received from the monitor signal generator 80 and monitor signals received at the time of the last update to send the difference values "$D_1$", "$D_2$" to the determining unit 254. Then, based on the two difference results, the determining unit 254 selects and reads an appropriate update mode from the mode table 253. That is, according to the update controller 250 shown in FIG. 8, the compensation data of each of the amplitude characteristic and the phase characteristic is updated based on the two kinds of monitor signals, and therefore detailed setting can be made for the update of the compensation data, which enables further reduction in power consumption.

Incidentally, in the example shown in FIG. 8, the compensation data of each of the amplitude characteristic and the phase characteristic is updated based on the two kinds of monitor signals, but this is not restrictive. Another possible structure may be that a first monitor signal is defined as a monitor signal for the update of the compensation data of the amplitude characteristic and a second monitor signal is defined as a monitor signal for the update of the compensation data of the phase characteristic, and the determining unit 254 updates the compensation data of the amplitude characteristic and the compensation data of the phase characteristic independently based on difference results for the respective monitor signals.

For example, as for the amplitude characteristic, the determining unit 254 compares the difference value "$D_1$" between monitor signal 1 and a corresponding threshold value "$s_1$", and when "$D_1$" is larger, it determines that the compensation data of the amplitude characteristic should be updated, and as for the phase characteristic, the determining unit 254 compares the difference value "$D_2$" between monitor signal 2 and a corresponding threshold value "$s_2$", and when "$D_2$" is larger, it determines that the compensation data of the phase characteristic should be updated. This is effective in a case where a characteristic of the monitor signal is highly correlated with one of the amplitude characteristic and the phase characteristic.

Next, examples of the configuration of the monitor signal generator generating the monitor signal given to the distortion compensator 20 of this embodiment will be described in detail with reference to FIG. 9 to FIG. 15. In the distortion compensator 20 of this embodiment, compensation data for distortion compensation is updated according to the operation state of the power amplifier 60. Therefore, as the monitor signal, a parameter influencing nonlinear distortion of the power amplifier 60 needs to be generated. Monitor signal generators 80 to 87 shown in FIG. 9 to FIG. 15 respectively generate monitor signals which have numerical values representing an increase/decrease of output power of the power amplifier (difference from rated output power), an adjacent channel leakage ratio (difference from a rated value), the occurrence of a phase difference in an analog stage, the occurrence of a gain in the analog stage, variation in characteristic coefficient of the power amplifier, temperature increase of the power amplifier, a change in used frequency.

Figure 9:
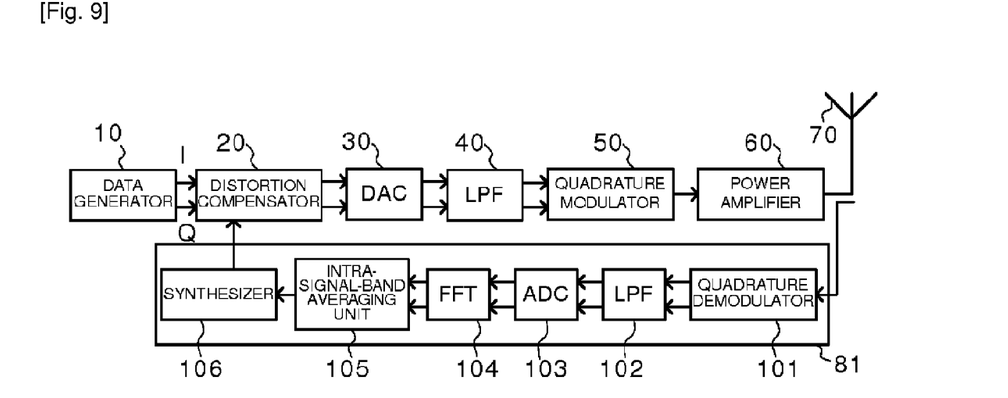
FIG. 9 is a block diagram showing a concrete example of a monitor signal generator of this embodiment.

The monitor signal generator 81 shown in FIG. 9 includes: a quadrature demodulator 101 obtaining part of output signals of the power amplifier 60 to apply quadrature demodulation processing to the obtained output signal; a low pass filter 102 cutting high frequency range of baseband signals resulting from the demodulation; an A/D converter 103 analog-digital converting the baseband signals with the high frequency range being cut; an FFT 104 applying fast Fourier transform to the digitally converted baseband signals to convert time-axis signals to frequency axis-signals; an intra-signal-band averaging unit 105 averaging powers in a desired signal band developed on a frequency axis; and a synthesizer 106 adding up the powers of signals in the signal band.

The quadrature demodulator 101, the low pass filter 102, and the A/D converter 103 correspond to the quadrature modulator 50, the low pass filter 40, and the D/A converter 30 respectively. That is, part of the output signals taken from the power amplifier 60 passes through the quadrature demodulator 101, the low pass filter 102, and the A/D converter 103 to be restored to the output signals of the distortion compensator 20. The restored signals are developed on the frequency axis by the FFT 104, the powers in the desired signal band are averaged by the intra-signal-band averaging unit 105, and power components of the respective signals are synthesized by the synthesizer 106. With such a structure, it is possible to obtain the output power of the power amplifier 60 in the desired signal band based on part of the output signals of the power amplifier 60.

In a case where the monitor signal is generated by the monitor signal generator 81, the threshold values "$s_1$", "$s_2$" of the update controller 25 are set to, for example, ±2 (plus or minus 2)[dB] and ±1 (plus or minus 1)[dB], and in the mode table 253, for example, an update mode when ±1 (plus or minus 1)[dB] is exceeded is set to the AM mode, and an update mode when ±2 (plus or minus 2)[dB] is exceeded is set to the AM+PM mode. By such setting, the distortion compensator 20 updates the compensation data of the amplitude characteristic when a variation width of the output power exceeds ±1 (plus or minus 1) [dB], and updates the compensation data of the phase characteristic in addition to the compensation data of the amplitude characteristic when the variation width exceeds ±2 (plus or minus 2)[dB]. That is, since the update contents and the update frequency are changed depending on whether the operation state of the power amplifier 60 is small or large, and therefore, it is possible to reduce power consumption in the distortion compensator 20.

Figure 10:
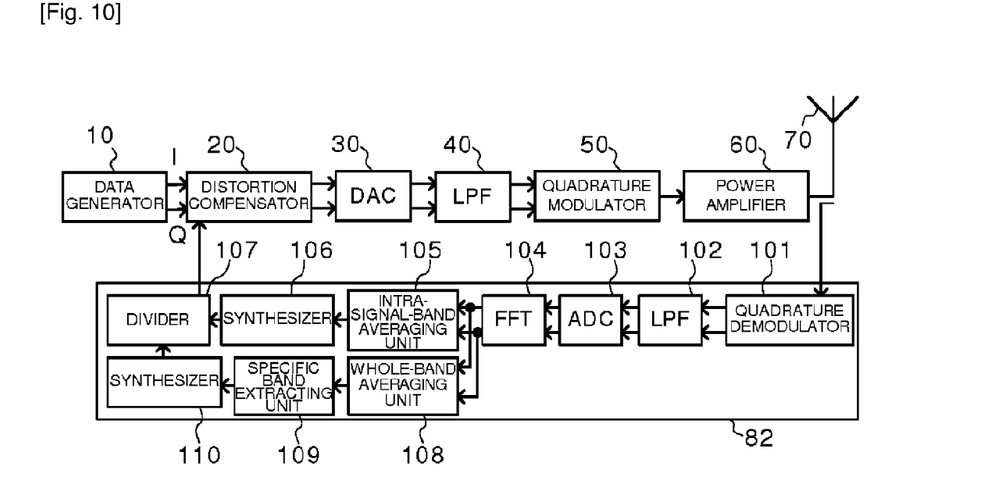
FIG. 10 is a block diagram showing a concrete example of the monitor signal generator of this embodiment.

The monitor signal generator 82 shown in FIG. 10 includes, in addition to the structure of the monitor signal generator 81 shown in FIG. 9, a whole-band averaging unit 108 obtaining part of the signals developed to the frequency-axis signals by the FFT 104 and averaging powers in the whole band of an operating frequency of the power amplifier 60; a specific band extracting unit 109 extracting signals in a frequency band adjacent to the desired frequency band, from the averaged signal in the whole band; a synthesizer 110 adding up powers of the extracted signals in the band; and a divider 107 performing division processing on an output of the synthesizer 110 by an output of the synthesizer 106.

The structures and operations of elements from the quadrature demodulator 101 to the synthesizer 106 are the same as those of the monitor signal generator 81. That is, part of the output signals taken from the power amplifier 60 passes through the quadrature demodulator 101, the low pass filter 102, and the A/D converter 103 to be restored to the output signals of the distortion compensator 20. The restored signals are developed on the frequency axis by the FFT 104, the powers in the whole band of the operating frequency of the power amplifier 60 are averaged by the whole-band averaging unit 108, the signals in the frequency band adjacent to the desired frequency band are extracted by the specific band extracting unit 109, and power components of the extracted signals in the band are synthesized by the synthesizer 110. With such a structure, it is possible to obtain the output power of the power amplifier 60 in the band adjacent to a target frequency band, based on part of the output signals of the power amplifier 60.

Then, the divider 107 divides the power in the adjacent frequency band outputted from the synthesizer 110 by the power in the target frequency band outputted from the synthesizer 106, whereby an adjacent channel leakage ratio can be obtained.

In a case where the monitor signal is generated by the monitor signal generator 82, the threshold values "$s_1$", "$s_2$" of the update controller 25 are set to, for example, −50 [dB] and −60 [dB], and in the mode table 253, for example, an update mode when −60 [dB] is exceeded is set to the AM mode, and an update mode when −50 [dB] is exceeded is set to the AM+PM mode. By such setting, the distortion compensator 20 updates the compensation data of the amplitude characteristic when the adjacent channel leakage ratio exceeds −60 [dB], and updates the compensation data of the phase characteristic in addition to the compensation data of the amplitude characteristic when the adjacent channel leakage ratio exceeds −50 [dB].

The adjacent channel leakage ratio represents a characteristic of a system and its deterioration cannot be tolerated. Therefore, when the adjacent channel leakage ratio exceeds −60 [dB], the compensation data of the amplitude characteristic having a strong influence on nonlinearity is first updated. Then, when the system characteristic further deteriorates and the adjacent channel leakage ratio exceeds −50 [dB], the compensation data of the phase characteristic in addition to the compensation data of the amplitude characteristic is updated. According to the monitor signal generator 82, since the compensation data used in the distortion compensator 20 is updated based on the adjacent channel leakage ratio prescribed as the communication condition, it is possible to reduce power consumption while more surely compensating nonlinear distortion.

Figure 11:
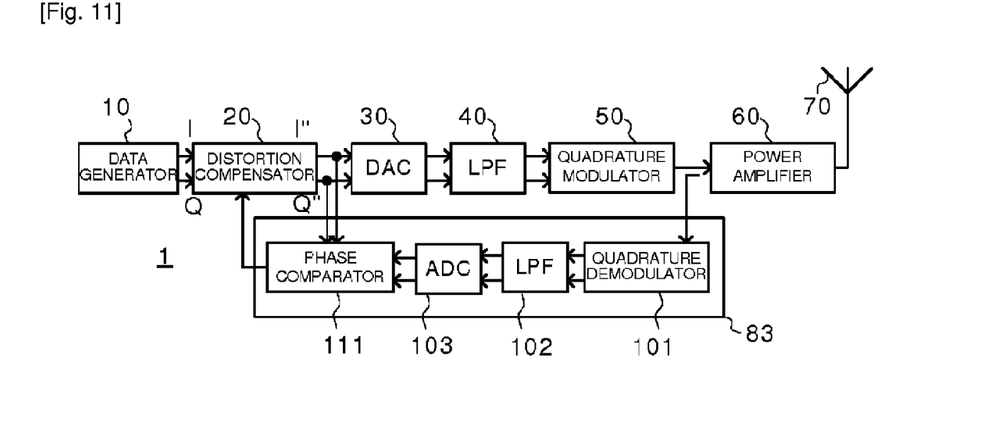
FIG. 11 is a block diagram showing a concrete example of the monitor signal generator of this embodiment.

The monitor signal generator 83 shown in FIG. 11 includes: a quadrature demodulator 101 obtaining part of the output signals of the power amplifier 60 to apply quadrature demodulation processing to the obtained signal; a low pass filter 102 cutting high frequency range of baseband signals resulting from the demodulation; an A/D converter 103 analog-digital converting the baseband signals with the high frequency range being cut; and a phase comparator 111 comparing a phase of the digitized baseband signals and a phase of the output signals of the distortion compensator 20.

The quadrature demodulator 101, the low pass filter 102, and the A/D converter 103 are the same as those of the monitor signal generator 81, and therefore repeated description thereof will be omitted.

The signals restored as a result of the processing from the quadrature demodulator 101 through the A/D converter 103 are inputted to the phase comparator 111. Meanwhile, the output signals of the distortion compensator 20 are also inputted to the phase comparator 111. Then, the phase comparator 111 compares the both input signals to convert a phase difference therebetween to a numerical value and outputs the numerical value as a monitor signal to the distortion compensator 20. That is, the monitor signal generator 83 can detect a phase change in the power amplifier 60.

In a case where the monitor signal is generated by the monitor signal generator 83, the threshold value "s" is set to 0, and in the mode table 253, for example, an update mode when a phase difference occurs is set to the PM mode. By such setting, the distortion compensator 20 updates the compensation data of the phase characteristic when phase distortion occurs. Since the phase change in the power amplifier 60 is a change arisen from the delay time, a nonlinear parameter need not be updated. Therefore, unnecessary update of the compensation data is not performed, which can reduce power consumption.

Figure 12:
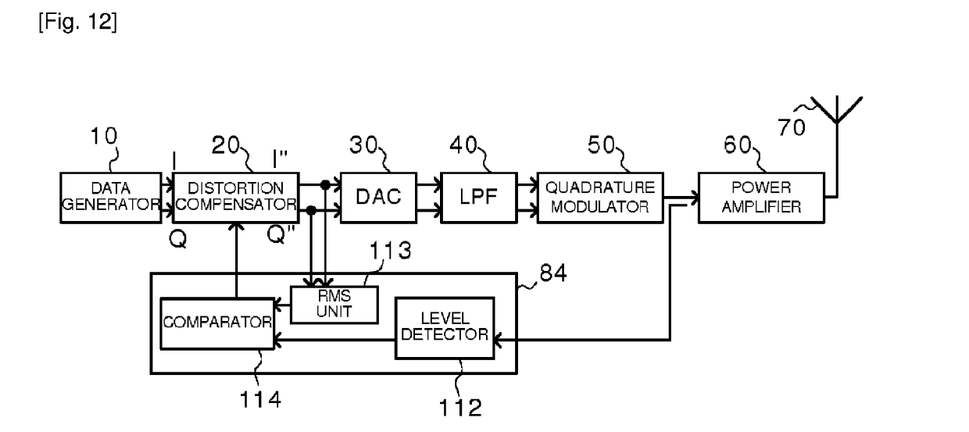
FIG. 12 is a block diagram showing a concrete example of the monitor signal generator of this embodiment.

The monitor signal generator 84 shown in FIG. 12 includes: a level detector 112 detecting signal level of an input signal to the power amplifier 60 (an output signal of the quadrature modulator 50); a RMS unit 113 performing a root mean square (RMS) operation on the output signals of the distortion compensator 20; and a comparator 114 comparing the signal level detected by the level detector 112 and the operation result obtained by the RMS unit 113.

The transmission signal outputted from the quadrature modulator 50 is inputted to the level detector 112, and the level detector 112 detects the signal level of the transmission signal. Meanwhile, the baseband signals I", Q" outputted from the distortion compensator 20 are inputted to the RMS unit 113, and the RMS unit 113 performs the root mean square operation on the baseband signals I", Q". Then, the comparator 114 compares the detection result of the signal level and the result of the root mean square operation and converts a difference therebetween to a numerical value to output the numerical value as the monitor signal to the distortion compensator 20. That is, the monitor signal generator 84 can detect a gain occurring in an analog stage from the D/A converter 30 to the quadrature modulator 50.

In a case where the monitor signal is generated by the monitor signal generator 84, the threshold values "$s_1$", "$s_2$" of the update controller 25 are set to, for example, ±0.6 (plus or minus 0.6)[dB] and ±0.3 (plus or minus 0.3)[dB], and in the mode table 253, for example, an update mode when ±0.3 (plus or minus 0.3)[dB] is exceeded is set to the AM mode, and an update mode when ±0.6 (plus or minus 0.6)[dB] is exceeded is set to the AM+PM mode. By such setting, the distortion compensator 20 updates the compensation data of the amplitude characteristic when the gain in the aforesaid analog stage exceeds ±0.3 (plus or minus 0.3)[dB], and updates the compensation data of the phase characteristic in addition to the compensation data of the amplitude characteristic when the gain exceeds ±0.6 (plus or minus 0.6)[dB].

The gain occurring in the analog signal processing stage increases/decreases the signal level. In the distortion compensator 20, the real multiplier 211 and the complex multiplier 221 read the compensation data from the amplitude inverse characteristic table 213 and the phase inverse characteristic table 223 in which the compensation data are stored in correspondence to the amplitude values, as addresses, calculated by the amplitude calculators 212 and 222, and therefore, the increase/decrease in the signal level directly influences accuracy of distortion correction. Therefore, it is preferable that the update of the compensation data of the amplitude characteristic is first executed by the AM mode with higher priority, and the compensation data of the phase characteristic is also updated when the state further deteriorates. Therefore, only the necessary update of the compensation data can be sufficiently performed, which can reduce power consumption.

Figure 13:
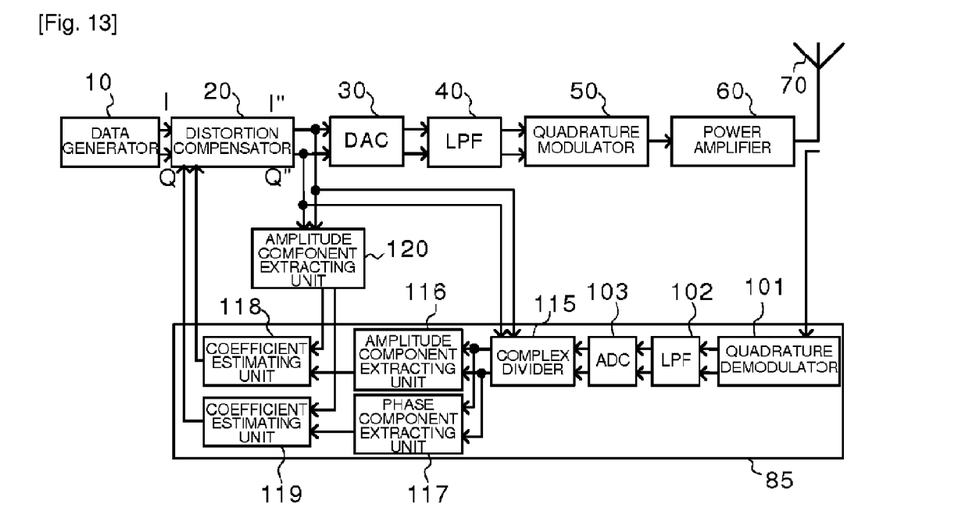
FIG. 13 is a block diagram showing a concrete example of the monitor signal generator of this embodiment.

The monitor signal generator 85 shown in FIG. 13 includes a quadrature demodulator 101 obtaining part of the output signals of the power amplifier 60 to apply quadrature demodulation processing to the obtained signal; a low pass filter 102 cutting high frequency range of the baseband signals generated by the demodulation; an A/D converter 103 analog-digital converting the baseband signals with the high frequency range being cut; a complex divider 115 performing a complex division operation on the digitized baseband signals; an amplitude component extracting unit 116 extracting amplitude components of the baseband signals resulting from the complex division processing; a phase component extracting unit 117 extracting phase components from the same; an amplitude component extracting unit 120 extracting amplitude components from the output baseband signals of the distortion compensator 20; and coefficient estimating units 118 and 119 estimating a characteristic coefficient of the power amplifier 60 based on the amplitude components/phase components extracted by the amplitude component extracting unit 116/phase component extracting unit 117 and the amplitude components extracted by the amplitude component extracting unit 120. The quadrature demodulator 101, the low pass filter 102, and the A/D converter 103 are the same as those of the monitor signal generator 81, and therefore repeated description thereof will be omitted.

Signals restored as a result of the processing from the quadrature demodulator 101 through the A/D converter 103 are inputted to the complex divider 115. Meanwhile, the output signals of the distortion compensator 20 are also inputted to the complex divider 115. The complex divider 115 performs the complex division operation on the signals sent from the A/D converter 103 by the signals from the distortion compensator 20.

The amplitude component extracting unit 116 and the phase component extracting unit 117 extract the amplitude components and the phase components of the signals resulting from the complex division operation to send them to the coefficient estimating units 118 and 119 respectively. Meanwhile, the amplitude components are extracted from the output signals of the distortion compensator 20 by the amplitude component extracting unit 120 to be sent to the coefficient estimating units 118 and 119. The coefficient estimating units 118 and 119 calculate the characteristic coefficient of the power amplifier 60 based on the signals from the amplitude component extracting unit 116/phase component extracting unit 117 and the signals from the amplitude component extracting unit 120 to send the characteristic coefficient to the distortion compensator 20. In this manner, the monitor signal generator 85 is capable of generating the characteristic coefficient of the power amplifier 60.

In a case where the monitor signal is generated by the monitor signal generator 85, in the mode table 253, for example, an update mode when the characteristic coefficient of the power amplifier 60 changes is set to the AM+PM mode. By such setting, the distortion compensator 20 updates the compensation data of the amplitude characteristic and the phase characteristic when the characteristic coefficient changes. When the characteristic coefficient of the power amplifier 60 greatly changes, high-level nonlinear distortion occurs, and therefore, the compensation data of the amplitude characteristic and the phase characteristic are both updated by the AM+PM mode.

However, when there occurs no change in the characteristic coefficient, the compensation data is not updated. By such setting, unnecessary update of the compensation data is not performed, which can reduce power consumption.

Figure 14:
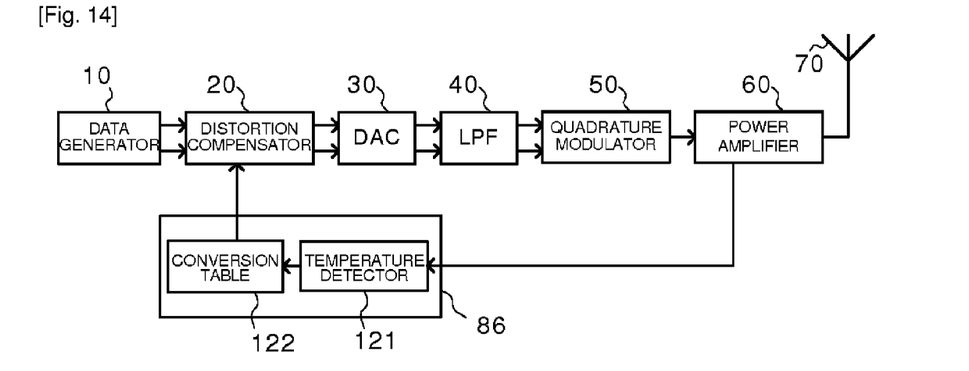
FIG. 14 is a block diagram showing a concrete example of the monitor signal generator of this embodiment.

The monitor signal generator 86 shown in FIG. 14 includes: a temperature detector 121 disposed near an amplifying element of the power amplifier 60 to detect temperature of the power amplifier 60; and a conversion table 122 giving corresponding compensation data to the distortion compensator 20 based on the detected temperature. The temperature detector 121 constantly monitors the temperature of the power amplifier 60 and inputs a temperature signal corresponding to the temperature to the conversion table 122. Based on the inputted temperature signal, the conversion table 122 inputs a corresponding monitor signal to the distortion compensator 20.

In a case where the monitor signal is generated by the monitor signal generator 86, the threshold values "$s_1$", "$s_2$" of the update controller 25 are set to, for example, ±50 (plus or minus 50) degrees centigrade and ±20 (plus or minus 20)

degrees centigrade and in the mode table 253, for example, an update mode when ±20 (plus or minus 20) degrees centigrade is exceeded is set to the AM mode, and an update mode when ±50 (plus or minus 50) degrees centigrade is exceeded is set to the AM+PM mode. By such setting, the distortion compensator 20 updates the compensation data of the amplitude characteristic when a temperature change of the power amplifier 60 exceeds ±20 (plus or minus 20) degrees centigrade, and updates the compensation data of the phase characteristic in addition to the compensation data of the amplitude characteristic when the temperature change exceeds ±50 (plus or minus 50) degrees centigrade.

Generally, the power amplifier is treated so as to release heat and thus its temperature change is slow, and if the temperature change is not sharp, a sharp change in the characteristic of the power amplifier seldom occurs. Therefore, when the temperature change is slow, only the compensation data of the amplitude characteristic is updated, and when a sharp temperature change occurs, the compensation data of the amplitude characteristic and the phase characteristic are both updated. Therefore, only the necessary update of the compensation data is sufficiently updated, which can reduce power consumption.

Figure 15:
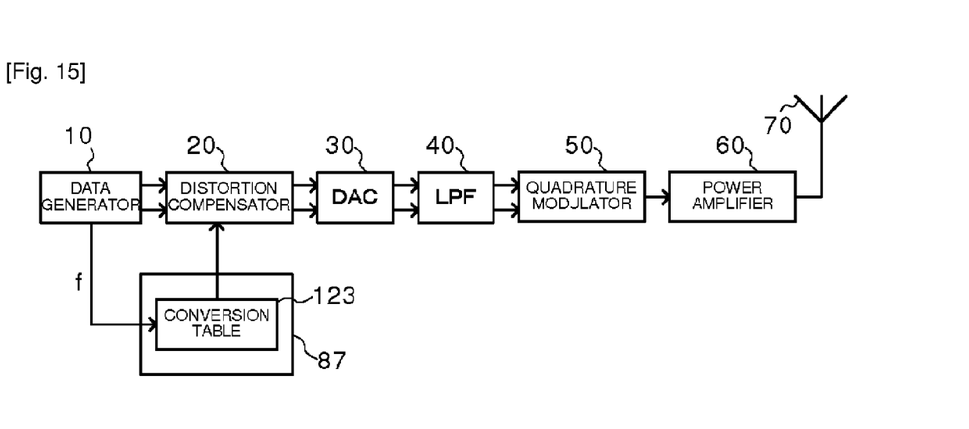
FIG. 15 is a block diagram showing a concrete example of the monitor signal generator of this embodiment.

The monitor signal generator 87 shown in FIG. 15 includes a conversion table 123 to which frequency information f of a transmission frequency (band) is inputted from the data generator 10. The conversion table 123 obtains the frequency information f from the data generator 10, and based on the frequency information f, the conversion table 123 inputs a corresponding monitor signal to the distortion compensator 20.

In a case where the monitor signal is generated by the monitor signal generator 87, in the mode table 253, for example, an update mode when the frequency information f changes is set to the AM+PM mode. Generally, when a frequency band of a signal amplified by the power amplifier 60 changes, nonlinear characteristics of the analog signal processing stage and the power amplifier 60 change, and therefore, the compensation data of the amplitude characteristic and the phase characteristic are both updated. By such setting, unnecessary update of the compensation data is not performed, which can reduce power consumption.

It should be noted that the structure of the monitor signal generator of this embodiment is not limited to the structures of the monitor signal generators 81 to 87 described above. For example, by providing a timer in the distortion compensator, the compensation data of both the amplitude characteristic and the phase characteristic may be updated at fixed time intervals. Such structure enables the minimum necessary update of the compensation data without generating a special monitor signal, which can reduce power consumption.

In the description of the above embodiment, the distortion compensator includes the amplitude inverse characteristic table and the phase inverse characteristic table as memories storing the amplitude data, but this is not restrictive. That is, instead of providing the table storing the compensation data, an arithmetic processor performing the compensation by a polynomial operation may be provided, thereby updating the compensation coefficient.

It should be noted that the present invention is not limited exactly to the above-described embodiment, but when being implemented, the invention can be embodied by modifying the constituent elements within a range not departing from the spirit of the invention. Further, various inventions can be formed by appropriately combining the plural constituent elements disclosed in the above-described embodiment. For example, some constituent elements out of all the constituent elements shown in the embodiment may be deleted. Moreover, constituent elements in different embodiments may be appropriately combined.

The invention claimed is:

1. A distortion compensator apparatus for compensating nonlinearity of an amplifier, comprising:
   a memory configured to store a first parameter used for correcting an amplitude component of an input signal of the amplifier and a second parameter used for correcting a phase component of the input signal;
   a compensator configured to correct the amplitude component of the input signal based on the first parameter and to correct the phase component of the input signal based on the second parameter; and
   an update controller configured to update at least one of the first and the second parameters according to an operation state of the amplifier and a plurality of update modes,
   wherein the update modes include a first mode to only update the first parameter, a second mode to only update the second parameter, and a third mode to update both of the first and the second parameters, and
   wherein said compensator comprises:
   a first amplitude calculator configured to calculate an amplitude value of the input signal;
   a real multiplier configured to perform real multiplication processing on the first parameter stored in said memory and the input signal, based on the amplitude value calculated by said first amplitude calculator;
   a second amplitude calculator configured to calculate an amplitude value of a signal resulting from the real multiplication processing; and
   a complex multiplier configured to perform complex multiplication processing on the second parameter stored in said memory and the signal resulting from the real multiplication processing, based on the amplitude value calculated by said second amplitude calculator.

2. The distortion compensator apparatus according to claim 1, further comprising a monitor signal generator configured to generate a monitor signal to indicate a characteristic of the amplifier by monitoring the operation state of the amplifier,
   wherein said update controller updates at least one of the first and the second parameters based on the monitor signal.

3. The distortion compensator apparatus according to claim 2, wherein said monitor signal generator generates a signal to indicate at least one of output power of the amplifier, an adjacent channel leakage ratio of the amplifier, a gain occurring on a preceding stage of the amplifier, a phase difference occurring on the preceding stage of the amplifier, a temperature of the amplifier, and a frequency of the input signal, as the monitor signal.

4. The distortion compensator apparatus according to claim 1, further comprising a timer configured to output a timing signal to indicate a timing for updating the first and the second parameters, and
   wherein said update controller updates at least one of the first and the second parameters based on the timing signal outputted by said timer.

5. An amplifier apparatus, comprising:
   an amplifier;
   a memory configured to store a first parameter used for correcting an amplitude component of an input signal of the amplifier and a second parameter used for correcting a phase component of the input signal in order to compensate nonlinearity of said amplifier;

a compensator configured to correct the amplitude component of the input signal based on the first parameter and to correct the phase component of the input signal based on the second parameter; and an update controller configured to update at least one of the first and the second parameters according to an operation state of said amplifier and a plurality of update modes, wherein the update modes include a first mode to only update the first parameter, a second mode to only update the second parameter, and a third mode to update both of the first and the second parameters, and wherein said compensator comprises:

a first amplitude calculator configured to calculate an amplitude value of the input signal;

a real multiplier configured to perform real multiplication processing on the first parameter stored in said memory and the input signal, based on the amplitude value calculated by said first amplitude calculator;

a second amplitude calculator configured to calculate an amplitude value of a signal resulting from the real multiplication processing; and a complex multiplier configured to perform complex multiplication processing on the second parameter stored in said memory and the signal resulting from the real multiplication processing, based on the amplitude value calculated by said second amplitude calculator.

6. The amplifier apparatus according to claim 5, further comprising a monitor signal generator configured to generate a monitor signal to indicate a characteristic of said amplifier by monitoring the operation state of said amplifier, wherein said update controller updates at least one of the first and the second parameters based on the monitor signal.

7. A transmitter, comprising:

the amplifier apparatus according to claim 5; and a modulator configured to modulate the input signal corrected by said compensator to input the modulated input signal to said amplifier.

8. A method of compensating distortion for compensating nonlinearity of an amplifier, comprising:

storing in a memory a first parameter used for correcting an amplitude component of an input signal of the amplifier and a second parameter used for correcting a phase component of the input signal;

correcting the amplitude component of the input signal based on the first parameter and the phase component of the input signal based on the second parameter; and updating at least one of the first and the second parameters according to an operation state of the amplifier and a plurality of update modes, wherein the update modes include a first mode to only update the first parameter, a second mode to only update the second parameter, and a third mode to update both of the first and the second parameters, and wherein said correcting comprises:

calculating a first amplitude value of the input signal;

performing real multiplication processing on the first parameter stored in said memory and the input signal, based on the first amplitude value;

calculating a second amplitude value of a signal resulting from the real multiplication processing; and performing complex multiplication processing on the second parameter stored in said memory and the signal resulting from the real multiplication processing, based on the second amplitude value.

* * * * *